(12) United States Patent
Chen

(10) Patent No.: US 8,867,284 B2
(45) Date of Patent: Oct. 21, 2014

(54) SEMICONDUCTOR ELEMENT AND OPERATING METHOD THEREOF

(75) Inventor: Chin-Fu Chen, Taoyuan County (TW)

(73) Assignee: United Microelectronics Corp., Hsinchu (TW)

( * ) Notice: Subject to any disclaimer, the term of this patent is extended or adjusted under 35 U.S.C. 154(b) by 33 days.

(21) Appl. No.: 13/486,010

(22) Filed: Jun. 1, 2012

(65) Prior Publication Data

US 2013/0322189 A1 Dec. 5, 2013

(51) Int. Cl.
*G11C 7/22* (2006.01)

(52) U.S. Cl.
USPC ..................................... 365/189.15; 365/177

(58) Field of Classification Search
USPC ............................................ 365/189.15, 177
See application file for complete search history.

(56) References Cited

U.S. PATENT DOCUMENTS

| | | | |
|---|---|---|---|
| 6,441,441 B1 * | 8/2002 | Suda | 257/370 |
| 6,825,524 B1 * | 11/2004 | Ikehashi et al. | 257/314 |
| 6,894,327 B1 | 5/2005 | Tsu-Jae | |
| 2003/0205759 A1 * | 11/2003 | Christensen et al. | 257/347 |

\* cited by examiner

*Primary Examiner* — Huan Hoang
(74) *Attorney, Agent, or Firm* — WPAT, PC; Justin King

(57) ABSTRACT

A semiconductor element and an operating method thereof are provided. The semiconductor element comprises a first metal oxide semiconductor (MOS) and a second MOS. The second MOS is electrically connected to the first MOS. The second MOS includes a floating bipolar junction transistor (BJT).

6 Claims, 3 Drawing Sheets

SEMICONDUCTOR ELEMENT AND OPERATING METHOD THEREOF

BACKGROUND

1. Technical Field

The disclosure relates in general to a semiconductor element and an operating method thereof, and more particularly to a semiconductor memory and an operating method thereof.

2. Description of the Related Art

With the development of semiconductor technology, varied semiconductor elements are invented. Those semiconductor elements are widely used in electric devices. Semiconductor memory can store digital data, so that the semiconductor memory plays an important role in varies electric devices.

Semiconductor memory stores data by a binary system. Each unit of the semiconductor memory is called as a memory cell. The memory cell can be selected to be controlled as two kinds of electric characteristics. According to the two kinds of electric characteristics, "0" and "1" can be defined for saving a binary data.

SUMMARY

The disclosure is directed to a semiconductor element and an operating method thereof. Two metal oxide semiconductors are combined to realize a function of a memory.

According to a first aspect of the present disclosure, a semiconductor element is provided. The semiconductor element comprises a first metal oxide semiconductor transistor (MOS transistor) and a second MOS transistor. The second MOS transistor is electrically connected to the first MOS transistor. The second MOS transistor includes a floating bipolar junction transistor (BJT).

According to a second aspect of the present disclosure, an operating method of a semiconductor element is provided. The semiconductor element comprises a first metal oxide semiconductor (MOS) transistor and a second MOS transistor. The second MOS transistor is electrically connected to the first MOS transistor. The second MOS transistor includes a floating bipolar junction transistor (BJT). The operating method of the semiconductor element comprises a writing process. The writing process includes the following steps. The first MOS transistor is turned on. The second MOS transistor is turned on. A first source voltage is applied to a first source of the first MOS transistor. A second source voltage is applied to a second source of the second MOS transistor, such that the floating BJT is turned on.

The above and other aspects of the disclosure will become better understood with regard to the following detailed description of the non-limiting embodiments. The following description is made with reference to the accompanying drawings.

DETAILED DESCRIPTION

Several embodiments are disclosed below for elaborating the invention. The following embodiments are for the purpose of elaboration only, not for limiting the scope of protection of the invention. Besides, secondary elements are omitted in the following embodiments to highlight the technical features of the invention.

Figure 1:
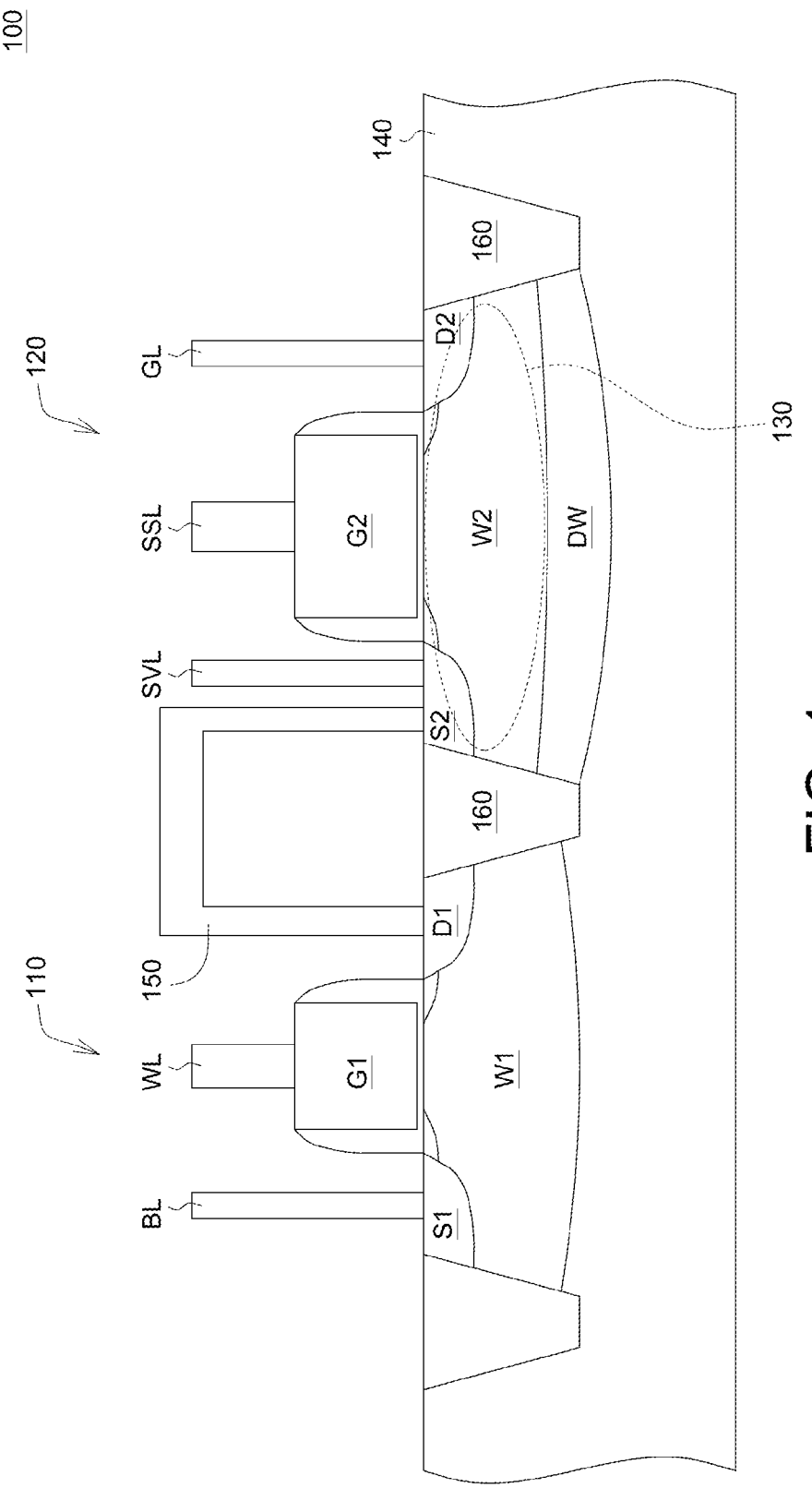
FIG. 1 shows a cross-sectional view of a semiconductor element of one embodiment.

Referring to FIG. 1, FIG. 1 shows a cross-sectional view of a semiconductor element 100 of one embodiment. The semiconductor element 100 comprises a first metal oxide semiconductor transistor (MOS transistor) 110 and a second MOS transistor 120. The second MOS transistor 120 is electrically connected to the first MOS transistor 110. The second MOS transistor 120 includes a floating bipolar junction transistor (BJT) 130. The floating BJT 130 is not connected to a base 140 and is floating in the semiconductor element 100.

In the present embodiment, the first MOS transistor 110 and the second MOS transistor 120 are both NMOS transistor, and the floating BJT 130 is a NPN BJT.

Regarding the first MOS transistor 110, the first MOS transistor 110 includes a first well W1, a source S1, a first drain D1 and a first gate G1. The first well W1 can be a P type well, for example. The first source S1 is disposed in the first well W1. The first drain D1 is disposed in the first well W1. The first source S1 and the first drain D1 can be two N type heavily doping regions, for example. The first gate G1 is disposed above the first well W1. The first gate G1 can be a polysilicon layer, for example. If the first gate G1 is applied an enough voltage, then the first source S1 and the first drain D1 can be electrically connected.

Regarding the second MOS transistor 120, the second MOS transistor 120 includes a second well W2, a second source S2, a second drain D2, a second gate G2 and a deep well DW. The second well W2 can be a P type well, for example. The second source S2 and the second drain D2 are disposed in the second well W2. The second source S2 and the second drain D2 can be two N type heavily doping regions, for example. The second gate G2 can be a polysilicon layer, for example. If the second gate G2 is applied an enough voltage, then the second source S2 and the second drain D2 can be electrically connected.

The semiconductor element 100 further comprises a shallow trench isolation (STI) 160. The STI 160 surrounds the second well W2, the second source S2 and the second drain D2 in a full circle. In the cross-sectional view, only part of the STI 160 located at the left side and the right side can be seen. The deep well DW is disposed under the second well W2 for isolating the second well W2 and the base 140. The N type second source S2, the P type second well W2 and the N type second drain D2 form the floating BJT 130. BJT 130 is called a "floating" BJT because the P type second well W2 does not have any pick-up point and does not couple to any power supply/source. The second gate G2 is located above the second well W2. If the second gate G2 and the second source S2 are applied an enough voltage, then the floating BJT 130 can be turned on.

Figure 2:
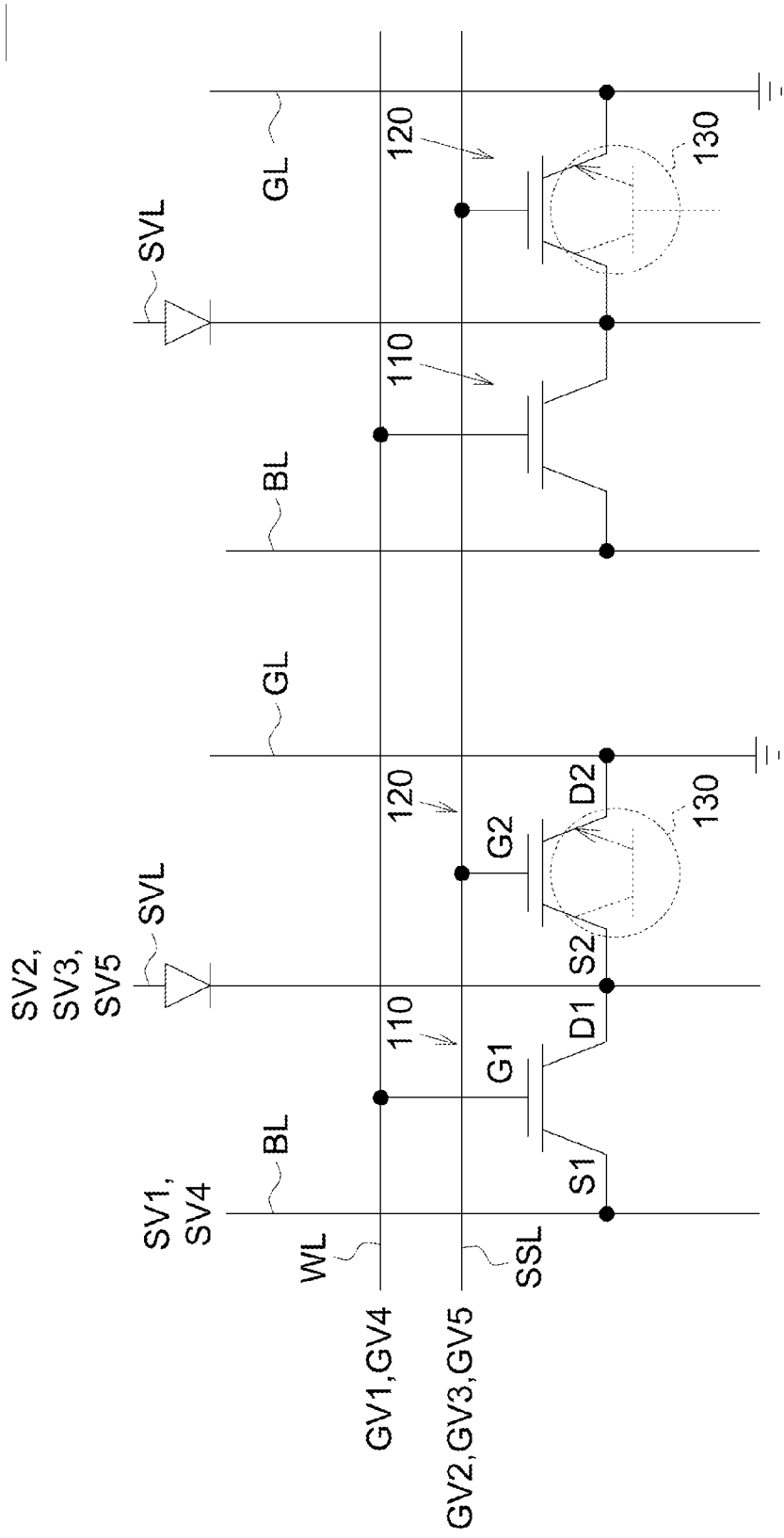
FIG. 2 is a circuit diagram of the semiconductor element of FIG. 1.

Please referring to FIGS. 1 to 2, FIG. 2 is a circuit diagram of the semiconductor element 100 of FIG. 1. The first drain D1 is electrically connected to the second source S2 via the conductive layer 150. Referring to FIG. 2, the first drain D1 of the first MOS transistor 110 located at the left side is electrically connected to the second source S2 of the second MOS transistor 120 located at the right side. Further, the floating BJT 130 is formed between the second S2 and the second drain D2.

Referring to FIGS. 1 to 2, the semiconductor element 100 further comprises a bit line BL, a word line WL, a store voltage line SVL, a state switch line SSL and a ground line GL. The bit line BL is electrically connected to the first source S1. The word line WL is electrically connected to the first gate G1. The store voltage line SVL is electrically connected to the first drain D1 and the second source S2. The state switch line SSL is electrically connected to the second gate G2. The ground line GL is electrically connected to the second drain D2.

Figure 3:
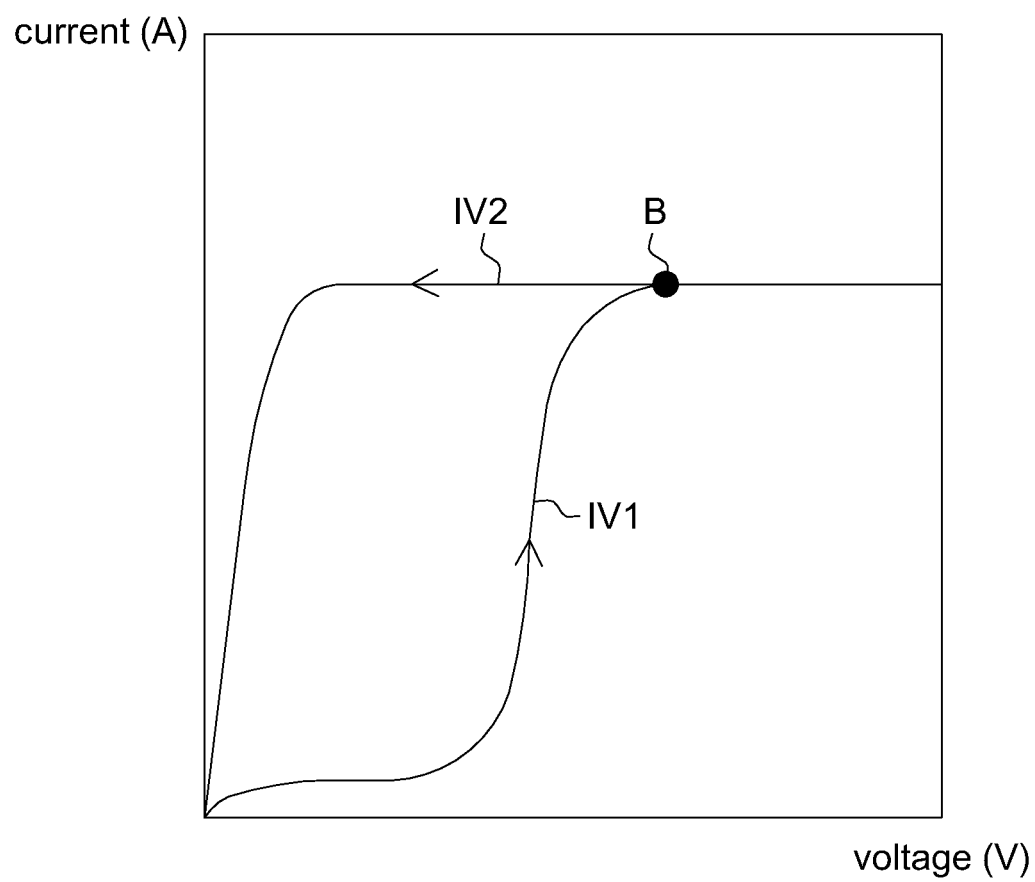
FIG. 3 shows a current-voltage curve of the semiconductor element of FIG. 1 during an operating process.

Please referring to FIG. 3, FIG. 3 shows a current-voltage curve of the semiconductor element 100 of FIG. 1 during an operating process. The operating process includes a writing process, a data holding process, a reading process and an erasing process. The writing process is used for writing data into the semiconductor element 100. The data holding process is used for holding the data stored in the semiconductor element 100. The reading process is used for determining whether the semiconductor element 100 is already written any data. The erasing process is used for erasing data stored in the semiconductor element 100.

Those processes are illustrated by a table shown as follow. Table 1 shows how to apply voltage to the first MOS transistor 110 and the second MOS transistor 120 in those processes.

TABLE 1

|  | first MOS transistor 110 | | second MOS transistor 120 | |
| --- | --- | --- | --- | --- |
|  | word line WL (first gate G1) | bit line BL (first source) | state switch line SSL (second gate G2) | store voltage line SVL (second source S2) |
| writing process | gate voltage GV1 | source voltage SV1 | gate voltage GV2 | source voltage SV2 |
| data holding process | off | off | gate voltage GV3 | source voltage SV3 |
| Reading process | gate voltage GV4 | source voltage SV4 | gate source GV5 | source voltage SV5 |
| erasing process | off | off | off | off |

Regarding the writing process, please referring to table 1 and FIGS. 2 to 3, a gate voltage GV1 is applied to the first gate G1 of the first MOS transistor 110 via the word line WL for turning on the first MOS transistor 110.

Moreover, a gate voltage GV2 is applied to the second gate G2 of the second MOS transistor 120 via the state switch line SSL for turning on the second MOS transistor 120.

Furthermore, a source voltage SV1 is applied to the first source S1 of the first MOS transistor 110 via the bit line BL.

Moreover, a source voltage SV2 is applied to the second source S2 of the second MOS transistor 120 via the store voltage line SVL for turning on the floating BJT 130.

Referring to FIG. 3, during the writing process, the current-voltage curve IV1 rises while the second MOS transistor 120 is turned on. When the floating BJT 130 is turned on, the current-voltage IV1 will rises to a point B.

Regarding the data holding process, please referring to table 1 and FIGS. 2 to 3, the word line WL and the bit line BL are not applied any voltage for turning off the first semiconductor 110.

Furthermore, a gate voltage GV3 is applied to the second gate G2 of the second MOS transistor 120 via the state switch line SSL for turning on the second MOS transistor 120. The gate voltage GV3 is less than the gate voltage GV2.

Moreover, a source voltage SV3 is applied to the second source S2 of the second MOS transistor 120 via the store voltage SVL for keeping turning on the floating BJT 130. The source voltage SV3 is substantially equal to the source voltage SV2.

Referring to FIG. 3, during the data holding process, the second MOS transistor 120 will keep at the point B.

Regarding the reading process, please referring to table 1 and FIGS. 2 to 3, a gate voltage GV4 is applied to the first gate G1 of the first MOS transistor 110 via the word line WL for turning on the first MOS transistor 110. The gate voltage GV4 is less than the gate voltage GV1.

Moreover, a gate voltage GV5 is applied to the second gate G2 of the second MOS transistor 120 via the state switch line SSL for turning on the second MOS transistor 120. The gate voltage GV5 is between the gate voltage GV2 and the gate voltage GV3.

Furthermore, a source voltage SV4 is applied to the first source S1 of the first MOS transistor 110 via the bit line BL. The source voltage SV4 is less then the source voltage SV1.

Moreover, a source voltage SV5 is applied to the second source S2 of the second MOS transistor 120 via the store voltage SVL. The source voltage SV5 is substantially equal to the source voltage SV2 and the source voltage SV3.

Referring to FIG. 3, during the reading process, the floating BJT 130 which is turned on keeps the current at a predetermined level, such that the current-voltage curve IV2 is decreased slightly. Until the voltage is too low to turn off the floating BJT 130 and the second MOS transistor 120, the current-voltage curve IV2 will be decreased largely.

That is to say, the current-voltage curve IV1-IV2 are different during the writing process and the reading process. Therefore, whether the semiconductor element 100 has been written data can be determined during the reading process.

Regarding the erasing process, it is only needed to turn off the word line WL, the bit line BL, the store voltage line SVL and the state switch line SSL to erase the data stored in the semiconductor element 100.

As such, the semiconductor element 100 can be realized the function of a memory via the first MOS transistor 110 and the second MOS transistor 120.

While the disclosure has been described by way of example and in terms of the exemplary embodiments, it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor element, comprising:
a first metal oxide semiconductor transistor (MOS transistor), wherein the first MOS transistor comprises:
a first well;
a first source, disposed in the first well;
a first drain, disposed in the first well; and
a first gate, disposed above the first well;
a shallow trench isolation (STI); and
a second MOS transistor, electrically connected to the first MOS transistor, wherein the second MOS transistor comprises:
a second well;
a second source, disposed in the second well;
a second drain, disposed in the second well;
a second gate, disposed above the second well, wherein the shallow trench isolation surrounds the second well, the second source and the second drain to form a floating bipolar junction transistor (BJT); and a deep well, disposed below the second well.

2. The semiconductor element according to claim 1, wherein the first drain is electrically connected to the second source.

3. The semiconductor element according to claim 2, further comprising:

a bit line, electrically connected to the first source;

a word line, electrically connected to the first gate;

a store voltage line, electrically connected to the first drain and the second source;

a state switch line, electrically connected to the second gate; and a ground line, electrically connected to the second drain.

4. An operating method of a semiconductor element, wherein the semiconductor element comprises a first metal oxide semiconductor transistor (MOS transistor) and a second MOS transistor, the second MOS transistor is electrically connected to the first MOS transistor, the second MOS transistor includes a floating bipolar junction transistor (BJT), the operating method of the semiconductor element comprises a writing process, and the writing process includes:

turning on the first MOS transistor;

turning on the second MOS transistor;

applying a first source voltage to a first source of the first MOS transistor; and applying a second source voltage to a second source of the second MOS transistor, such that the floating BJT is turned on.

5. The operating method of the semiconductor element according to claim 4, further comprising a data holding process, wherein the data holding process includes:

turning off the first MOS transistor; and turn on the second MOS transistor.

6. The operating method of the semiconductor element according to claim 5, further comprising a reading process, wherein the reading process includes:

turning on the first MOS transistor;

turning on the second MOS transistor;

applying a third source voltage to the first source of the first MOS transistor, the third source voltage being lower than the first source voltage; and applying a fourth source voltage to the second source of the second MOS transistor, the fourth source voltage being substantially equal to the second source voltage.

* * * * *